US 8,299,461 B2

(12) United States Patent
Tanaka et al.

(10) Patent No.: US 8,299,461 B2
(45) Date of Patent: Oct. 30, 2012

(54) THIN FILM TRANSISTOR, METHOD OF PRODUCING THE SAME, ELECTROOPTIC APPARATUS, AND SENSOR

(75) Inventors: Atsushi Tanaka, Kanagawa (JP); Takeshi Hama, Kanagawa (JP); Masayuki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 229 days.

(21) Appl. No.: 12/797,632

(22) Filed: Jun. 10, 2010

(65) Prior Publication Data

US 2010/0314618 A1      Dec. 16, 2010

(30) Foreign Application Priority Data

Jun. 11, 2009 (JP) .................. 2009-140426

(51) Int. Cl.
*H01L 29/12* (2006.01)
(52) U.S. Cl. .................. 257/43; 257/E29.296
(58) Field of Classification Search .......... None
See application file for complete search history.

(56) References Cited

U.S. PATENT DOCUMENTS

| | | | |
|---|---|---|---|
| 2006/0108529 A1* | 5/2006 | Saito et al. | 250/338.4 |
| 2008/0038882 A1* | 2/2008 | Takechi et al. | 438/151 |
| 2008/0073653 A1* | 3/2008 | Iwasaki | 257/79 |
| 2008/0296568 A1* | 12/2008 | Ryu et al. | 257/43 |
| 2010/0276682 A1* | 11/2010 | Yeh et al. | 257/43 |

FOREIGN PATENT DOCUMENTS

JP    2007-073701 A    3/2007

OTHER PUBLICATIONS

Science, 300 (2003) pp. 1269-1272.
Nature, 432 (2004) pp. 488-492.

\* cited by examiner

*Primary Examiner* — Fei Fei Yeung Lopez
(74) *Attorney, Agent, or Firm* — SOLARIS Intellectual Property Group, PLLC

(57) ABSTRACT

A thin film transistor includes: a substrate; and, on the substrate, an oxide semiconductor film which serves as an active layer and contains In, Ga, and Zn, a gate electrode, a gate insulating film, a source electrode, and a drain electrode, wherein, when a molar ratio of In, Ga, and Zn in the oxide semiconductor film is expressed as In:Ga:Zn=(2.0−x):x:y, wherein $0.0 < x < 2.0$ and $0.0 < y$, the distribution of y in the thickness direction of the oxide semiconductor film is such that the oxide semiconductor film has a region at which a value of y is larger than that at a surface of the oxide semiconductor film at a side closer to the substrate and that at a surface of the oxide semiconductor film at a side farther from the substrate.

14 Claims, 8 Drawing Sheets

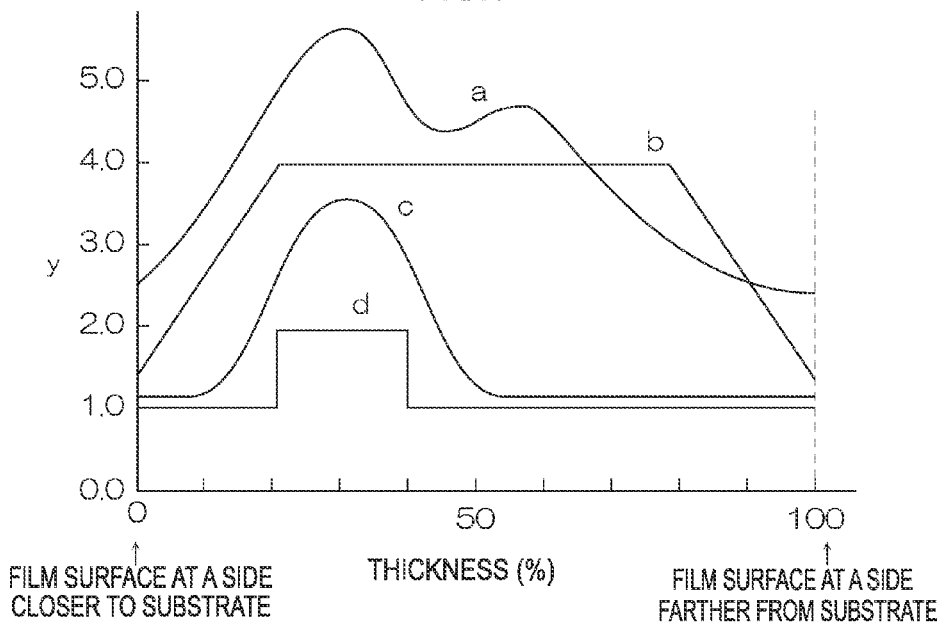
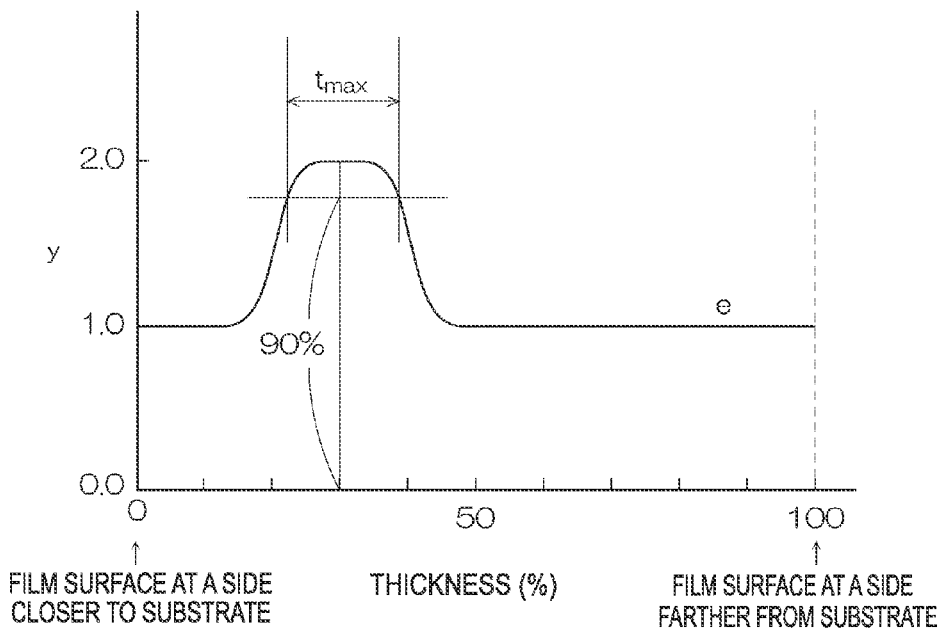

FIG.3
(A) 
(B) 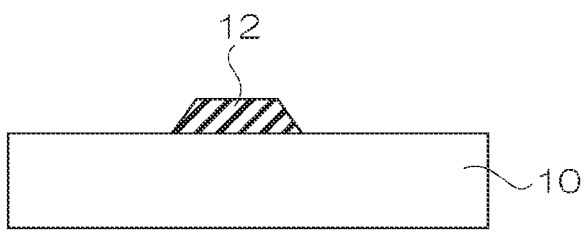
(C) 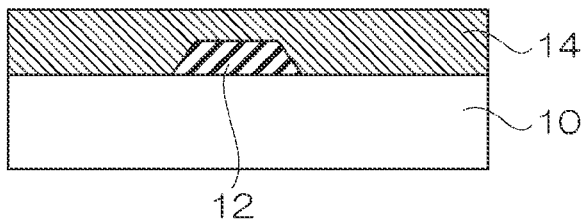
(D) 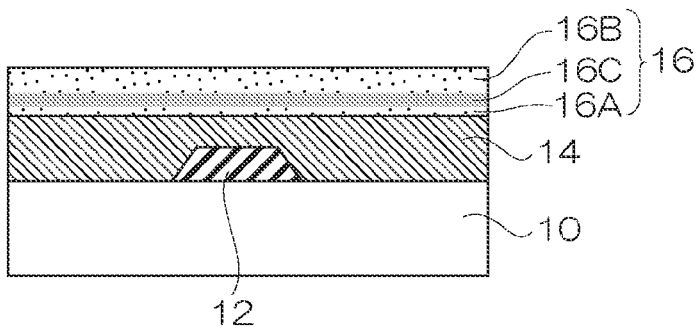

y[m=1(10nm)/y(10nm)/1(30nm)] vs. μ y[m=1(10nm)/y(10nm)/1(30nm)] vs. Ion/Ioff

THIN FILM TRANSISTOR, METHOD OF PRODUCING THE SAME, ELECTROOPTIC APPARATUS, AND SENSOR

CROSS-REFERENCE TO RELATED APPLICATION

This Application claims priority under 35 USC 119 from Japanese Patent Application No. 2009-140426, filed on Jun. 11, 2009, the disclosure of which is incorporated by reference herein.

BACKGROUND OF THE INVENTION

1. Field of Invention

The present invention relates to a thin film transistor, a method of producing the same, an electrooptic apparatus, and a sensor.

2. Description of the Related Art

Since the report made by the group led by Professor Hideo Hosono (Frontier Research Center & Materials and Structures Laboratory of the Tokyo Institute of Technology) and other researchers, there has been an increase in studies of the application of In—Ga—Zn—O oxide materials (also which may be referred to as "IGZO" or "IGZO materials" hereinafter) to active layers of thin film transistors (TFTs) (see, for example, Science, 300 (2003) 1269, Nature, 432 (2004) 488).

The IGZO materials exhibit higher carrier mobility than that of amorphous silicon (a-Si). In addition, IGZO materials can be formed into films on resin substrates at low temperatures. For these reasons, it is expected that IGZO materials will be applied to, for example, driving elements of flexible displays or the like in the future.

As an example of a TFT prepared using an IGZO material, a TFT is disclosed in which an active layer, as well as a high-resistance layer that is arranged between the active layer and a gate insulating film, are formed from IGZO material, thereby attaining excellent TFT properties (see, for example, Japanese Patent Application Laid-Open (JP-A) No. 2007-73701).

SUMMARY OF THE INVENTION

In the TFTs prepared using IGZO materials, including the TFT disclosed in JP-A No. 2007-73701, on-state currents may be low, and the properties of the transistors may shift (deviate) from ideal properties as transistors.

The present invention has been made in view of the above circumstances and provides a thin film transistor, a method of producing the same, an electrooptic apparatus, and a sensor.

According to a first aspect of the invention, there is provided a thin film transistor including:

a substrate; and, on the substrate, an oxide semiconductor film which serves as an active layer and contains In, Ga, and Zn, a gate electrode, a gate insulating film, a source electrode, and a drain electrode, wherein, when a molar ratio of In, Ga, and Zn in the oxide semiconductor film is expressed as In:Ga:Zn=(2.0−x):x:y wherein the inequalities 0.0<x<2.0 and 0.0<y are satisfied, the distribution of y in the thickness direction of the oxide semiconductor film has a region at which a value of y is larger than that at a surface of the oxide semiconductor film at a side closer to the substrate and that at a surface of the oxide semiconductor film at a side farther from the substrate.

According to a second aspect of the invention, there is provided a method of producing the thin film transistor according to the first aspect of invention, the method including: forming at least a part of the oxide semiconductor film, including a region at which the value of y is at least 90% of the absolute maximum value thereof over an entire thickness of the oxide semiconductor film, by a series of consecutive film-forming processes during which the part of the oxide semiconductor film is not exposed to the atmosphere.

According to a third aspect of the invention, there is provided an electrooptic apparatus including the thin film transistor of the first aspect of invention.

According to a fourth aspect of the invention, there is provided a sensor comprising the thin film transistor of the first aspect of invention.

BRIEF DESCRIPTION OF THE DRAWINGS

FIG. 1 is a conceptual diagram showing an example of y distribution in the film thickness direction of an IGZO film in the invention;

FIG. 2 is a conceptual diagram showing an example of y distribution in the film thickness direction of an IGZO film in the invention;

FIG. 3 is a flow chart showing an example of a method of producing a thin film transistor (TFT) according to the invention;

DETAILED DESCRIPTION OF THE INVENTION

Figure 4:
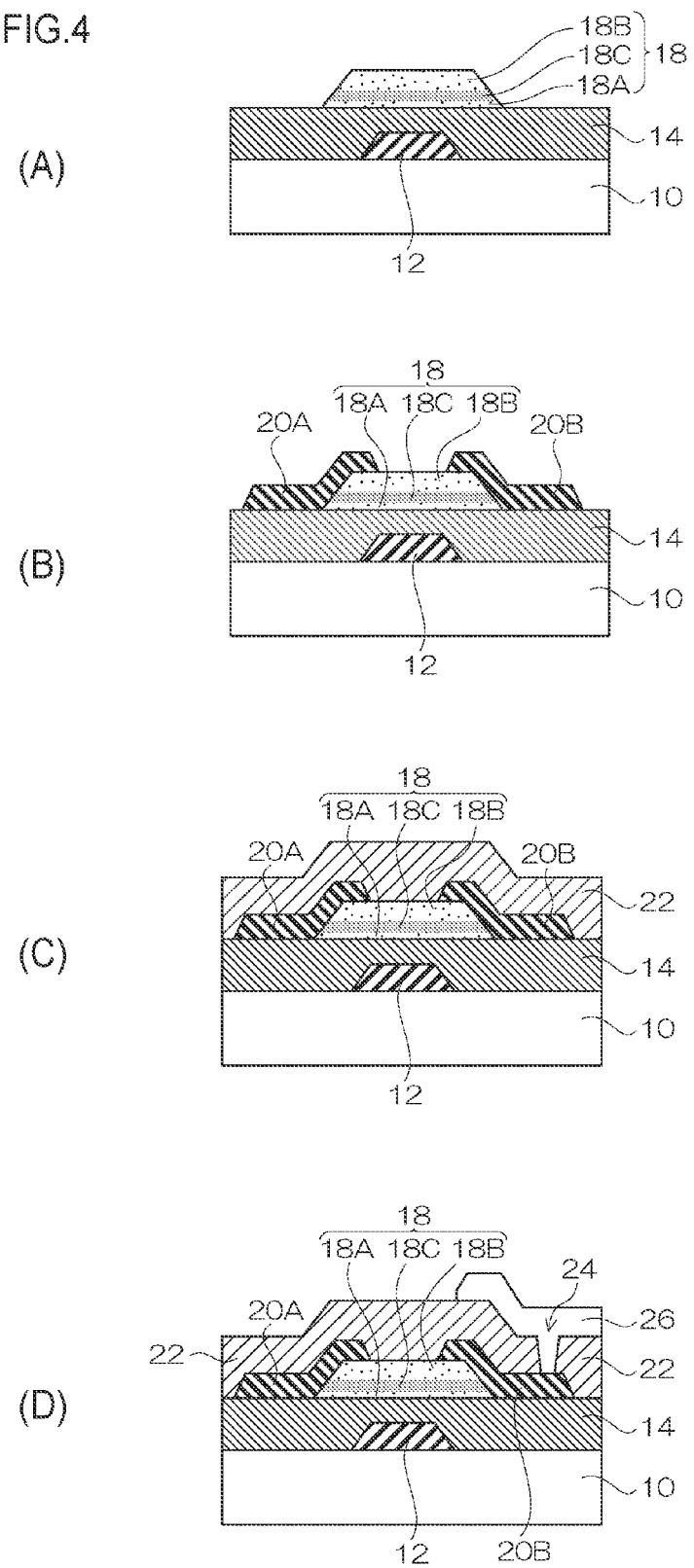
FIG. 4 is a flow chart showing an example of a method of producing a thin film transistor (TFT) according to the invention.

Thin Film Transistor and Method of Producing the Same

A thin film transistor of the invention includes a substrate, and an oxide semiconductor film, a gate electrode, a gate insulating film, a source electrode, and a drain electrode, which are provided on the substrate, the oxide semiconductor film including In, Ga, and Zn and serving as an active layer. In the thin film transistor, when the molar ratio of In, Ga, and Zn (i.e., In:Ga:Zn ratio) of the oxide semiconductor film is expressed by an expression, In:Ga:Zn=(2.0−x):x:y (wherein 0.0<x<2.0, and 0.0<y are satisfied), the distribution of y (which may be referred to as "y distribution" hereinafter) in the thickness direction of the oxide semiconductor film has a region, in the thickness direction of the oxide semiconductor film, at which the value of y (which may be referred to as "y value" hereinafter) is larger than the value of y at a film surface at a side closer to the substrate and the value of y at a film surface at a side farther from the substrate.

In recent years, studies have been conducted on application of an oxide semiconductor film containing In, Ga, and Zn (which may be referred to as "IGZO film" hereinafter) to an active layer of a thin film transistor (which may be referred to as "TFT" hereinafter). In general, IGZO films that have been used so far have a molar ratio of the respective metal elements (i.e., In:Ga:Zn ratio) in the IGZO film of 1.0:1.0:1.0 or about 1.0:1.0:1.0.

However, when the IGZO film having such a molar ratio is used as an active layer of a TFT, the on-state current may be insufficient.

In this regard, when an IGZO film, in which the molar ratio of Zn is increased to have an In:Ga:Zn ratio of from 1.0:1.0:2.0 to 1.0:1.0:5.0, is used as the active layer of a TFT, the on-state current obtained tends to be increased. However, the increased Zn ratio results in a decrease of the resistance of the active layer, and thus significantly changes TFT properties (specifically, shifting the Vg-Id characteristic curve of the TFT towards the negative Vg side (hereinafter referred to as "characteristics shift" in some cases); this shift is observed in the case of, for example, the characteristics curve for "In:Ga:Zn=1:1:2 shown in FIG. 8). When the shift is large, negative gate bias has to be applied to the TFT in order to turn off the TFT.

In this regard, when a TFT is made to have the configuration of the invention so as to have a Zn-rich region (region having a high Zn molar ratio) in an active layer, the characteristics shift can be prevented while a high on-state current (i.e., high carrier mobility) is attained.

Furthermore, according to the invention, since the characteristics shift can be reduced, the gate bias applied for causing the TFT to get into the off-state can be reduced. In other words, a normally-off TFT can easily be obtained while a high on-state current (i.e., high carrier mobility) is attained.

In addition, according to the invention, since the gate bias is reduced, electrical consumption for driving a TFT can be reduced.

In the invention, a state where a high on-state current is attained and the characteristics shift is reduced, and a state where, in addition to these conditions, a low off-state current is attained may be simply referred to "having excellent transistor properties".

In the following, an example of the IGZO film of the invention is described by referring to FIGS. 1 and 2. However, the invention is not limited to this example.

Each of FIGS. 1 and 2 is a conceptual diagram showing an example of y distribution in the film thickness direction of an IGZO film of the invention.

In FIGS. 1 and 2, the horizontal axis indicates percentage-wise a film thickness of an IGZO film, in which a film thickness of "0%" indicates a surface of the IGZO film at a side closer to a substrate, and a film thickness of "100%" indicates a surface of the IGZO film at a side farther from the substrate.

In FIGS. 1 and 2, the vertical axis indicates the y value when the molar ratio of In, Ga, and Zn (i.e., In:Ga:Zn molar ratio) is expressed by the expression, In:Ga:Zn=(2.0−x):x:y (provided that $0.0<x<2.0$, and $0.0<y$ are satisfied).

In FIGS. 1 and 2, distribution curves "a" to "e" each represent examples of y distribution of the invention, and each shows that a region at which the y value is larger than that at the film surface at a side closer to a substrate (i.e., the position indicated by the thickness of 0% in FIGS. 1 and 2) and the film surface at a side farther from the substrate (i.e., the position indicated by the thickness of 100% in FIGS. 1 and 2). In other words, the IGZO film of the invention includes, at the interior of the film, a region at which the y value is larger than the y values at both surfaces (i.e., the film surface at a side closer to the substrate and the film surface at a side farther from the substrate) of the IGZO film.

The region at interior of the film at which the y value is relatively high (i.e., Zn-rich region) contributes to increase in on-state current.

Meanwhile, regions which are present at both surfaces of the film and at which the y values are relatively low contribute to reducing characteristics shift.

The y distribution in the thickness direction in the invention may be measured by element analysis in the depth direction by X-ray photoelectron spectroscopy (XPS) or secondary ion mass spectrometry (SIMS), or by cross-sectional TEM-EDX, for example. For example, the y distribution in a cross-sectional sample which has been processed by focused ion beam (FIB) is measured by energy dispersive X-ray spectroscopy (EDX) in combination with transmission electron microscopy (acceleration voltage: 200 kV to 300 kV). The line analysis may be performed under the conditions of a beam diameter of 1 nm or less and a resolution of from 120 to 150 eV, whereby highly accurate element distribution in the thickness direction can be evaluated. For example, the evaluation may be performed using a transmission electron microscope (TEM) (trade name: HD-2700, manufactured by Hitachi Hi-Technologies Corporation) and an energy dispersive X-ray spectrometer (EDX) (trade name: GENESIS, manufactured by EDAX) under the following conditions; beam diameter: 0.4 nm, measurement time per 1 point: 1 second, and the number of measurement points incorporated: from 200 to 300 for a sample having a thickness of about 100 nm.

In the invention, the film surface at a side closer to the substrate corresponds to the surface of an IGZO film at a side closer to a gate insulating film in a bottom-gate TFT, and corresponds to the surface of an IGZO film at a side farther from a gate insulating film in a top-gate TFT.

The film surface at a side farther from the substrate corresponds to the surface of an IGZO film at a side farther from a gate insulating film in a bottom-gate TFT, and corresponds to the surface of an IGZO film at a side closer to a gate insulating film in a top-gate TFT.

When a y value at the IGZO film surface at a side closer to a gate insulating film is larger than the y value at an internal portion of the IGZO film, a channel is formed at the interface between the IGZO film surface and the gate insulating film. Accordingly, owing to deficiency, contaminants, and the like which are present at the interface (i.e., contact surface between the gate insulating film and the IGZO film), the on-state current (carrier mobility) may be reduced, or transistor properties may become unstable.

When the y value at the IGZO film surface at a side farther from a gate insulating film is larger than the y value at an internal portion of the IGZO film, the off-state current may be increased, adequate on/off ratio may not be attained, or transistor properties may be unstable.

The y distribution in the thickness direction may be a curved distribution (e.g., distribution curve "a" shown in FIG. 1), a linear distribution (e.g., distribution curve "b" or "d" shown in FIG. 1), or a distribution curve including a curved portion and a linear portion (e.g., distribution curve "c" shown in FIG. 1 or distribution curve "e" shown in FIG. 2).

In the following, embodiments of the y distribution, which are further preferable from the viewpoint of more effectively exerting the effect of the invention, are described.

From the viewpoint of increasing an on-state current (carrier mobility), the absolute maximum y value over the y distribution is preferably 1.8 or more (see, for example, distribution curves "a" to "e" shown in FIGS. 1 and 2).

From the viewpoint of increasing an on-state current (carrier mobility), the absolute maximum y value is preferably 5.0 or less (see, for example, distribution curves "b" to "e" shown in FIGS. 1 and 2).

Accordingly, from the viewpoint of increasing an on-state current (carrier mobility), the absolute maximum y value over the y distribution is more preferably from 1.8 to 5.0, further more preferably from 1.8 to 4.0, even more preferably from 1.8 to 3.0, and particularly preferably from 1.8 to 2.2.

It is preferable that at least a part of the IGZO film (more preferably the entire IGZO film in the invention), which includes a region at which the y value is at least 90% of the absolute maximum y value, is formed by a series of consecutive film-forming processes, whereby contamination or deficiency at interfaces of respective regions due to the atmosphere can be prevented, and superior transistor properties can be attained. Moreover, the number of processes to form the IGZO film can be reduced, whereby production cost can be reduced.

As an example of conventional TFTs, JP-A No. 2007-73701 discloses that a TFT having good properties is obtained by forming an active layer as well as a high-resistance layer that is arranged between the active layer and a gate insulating film using an IGZO. JP-A No. 2007-73701 discloses that a suitable interface between the active layer and the high-resistance layer can be formed because the high-resistance layer in the amorphous state is planar. However, since the active layer and high-resistance layer are formed as independent layers having different shapes, and the high-resistance layer is formed after formation of a source electrode and a drain electrode subsequent to forming the active layer, the interface between the active layer and the high-resistance layer may easily be contaminated, or may have deficiency. Furthermore, since an interface of the active layer at a side opposite to the interface between the active layer and gate insulating layer is not treated, deficiency is likely to be generated and is one of the factors that affect the device properties. For these reasons, it has been difficult to obtain sufficient transistor properties regarding achievement of stability and reliability, and regarding achievement of both favorable on property and favorable off property. Moreover, increase in production cost due to increase in number of processes has been problematic.

In contrast to the disclosure of JP-A No. 2007-73701, an embodiment of "formation by a series of consecutive film-forming processes" used in the invention prevents contamination at the interface caused by the atmosphere and prevents occurrence of deficiency at the interface, resulting in superior transistor properties. In addition, the number of processes of forming the film can be reduced in the invention, whereby production cost can be reduced.

In the invention, from the viewpoint of effectively attaining the balance between the increase in on-state current and the suppression of characteristics shift, a thickness of a region at which y value is at least 90% of the absolute maximum y value of the oxide semiconductor film ($t_{max}$) is less than one-third of a total thickness of the oxide semiconductor film, as shown by the distribution curve "e" in FIG. 2.

The center, in the thickness direction, of the region at which the y value is at least 90% of the absolute maximum y value over the y distribution is preferably positioned at a side closer to the gate insulating film (or closer to the substrate when the TFT is a bottom-gate TFT) with respect to the center of the oxide semiconductor film in the thickness direction, whereby a channel can be formed in the region having a large y value, and the on-state current can be additionally increased.

For similar reasons, the region at which the y value is at least 90% of the absolute maximum y value over the y distribution is preferably included in a region ranging from 1 nm to 30 nm, in the thickness direction of the oxide semiconductor film, from the gate-insulating-film-side surface of the oxide semiconductor film (or, if the TFT is a bottom-gate TFT, from a surface of the oxide semiconductor film at a side closer to the substrate).

The IGZO film used in the invention is preferably amorphous.

Among IGZO films, an amorphous IGZO film can be formed at particularly low temperatures (for example, at a substrate temperature of 200° C. or less), and can be easily formed on a flexible resin substrate such as a plastic substrate. Accordingly, an amorphous IGZO film can be more easily applied to production of a flexible display having a plastic substrate with a TFT thereon.

Furthermore, it is easy to form a uniform film over a large area using the amorphous IGZO film, and variations of device properties can be reduced because the amorphous IGZO film is free from grain boundary unlike polycrystalline materials.

Whether the IGZO film is amorphous or not may be confirmed by X-ray diffraction. Specifically, when a distinct peak that indicates a crystalline structure is not found by X-ray diffraction, the IGZO film is determined to be amorphous.

Hereinafter, a surface of the IGZO film at a side closer to the substrate may be referred to as surface A of the IGZO film, and a surface of the IGZO film at a side farther from the substrate may be referred to as surface B of the IGZO film. From the viewpoints of effectively exerting the effect of the invention and facilitating production, it is preferable that the IGZO film of the invention includes: a first region which includes the surface A of the IGZO film and at which the y value is from 0.8 to 1.2; a second region which includes the surface B of the IGZO film and at which the y value is from 0.8 to 1.2; and a third region which includes a region at which y takes the absolute maximum value and at which the y value is 1.8 or more (for example, distribution curves "c", "d", and "e").

It is preferable that at least one of the change in y value from the first region to the third region and the change in y value from the third region to the second region is continuous (for example, distribution curves "a" to "c" and "e").

In the above, the thin film transistor of the invention is described focusing on the configuration of the IGZO film which serves as an active layer. Known configurations may be applied, without particular limitations, to configurations of other elements (such as a gate electrode, a gate insulating film, a source electrode, and a drain electrode).

The thin film transistor of the invention may have, as required, an additional element such as a known inter-layer insulating film (which may be referred to as "passivation film" or "protective film") or a known pixel electrode.

The thin film transistor of the invention may be a bottom-gate TFT or a top-gate TFT. From the viewpoint of effectively exerting the effect of the invention, the thin film transistor is preferably a bottom-gate TFT.

Embodiments

In the following, specific embodiments of a thin film transistor of the invention are described by referring to the production method thereof. However, the invention is not limited to these embodiments.

FIG. 3 and FIG. 4 are flow charts showing an example of a method of producing a thin film transistor (TFT) of the invention.

Substrate

First, a substrate 10 for forming a TFT is provided (see FIG. 3(A)).

The shape, structure, size and the like of the substrate 10 are not particularly limited, and appropriately selected in accordance with the intended purpose or the like. The substrate 10 may have a single layer structure, or may have a laminated structure (a multilayer structure).

The substrate 10 is not particularly limited, and examples thereof include inorganic substrates formed from zirconia-stabilized yttrium (YSZ) or glass; and resin substrates (which may be referred to as "plastic substrates" hereinafter) formed from a synthetic resin such as polyester (e.g., polyethylene terephthalate (PET), polybutylene terephthalate, or polyethylene naphthalate (PEN)), polystyrene, polycarbonate, polyether sulfone, polyarylate, allyl diglycol carbonate, polyimide, polycycloolefin, norbornene resin, or poly(chlorotrifluoro ethylene).

Of these, resin substrates are preferable from the viewpoints of being lightweight and having flexibility.

When the substrate 10 is a resin substrate, the resin substrate preferably has excellent heat resistance, excellent dimensional stability, excellent solvent resistance, excellent electrical insulation property, excellent workability, low gas permeability, low hygroscopic property, or the like.

In general, resin substrates have poor heat resistance. Therefore, when an electronic device is formed on a resin substrate, the process temperature in the production of the electronic device is preferably 200° C. or lower, more preferably 150° C. or lower, and particularly preferably 100° C. or lower.

In this regard, since an IGZO film, which can be formed (for example, by sputtering) at low temperatures, is used as a semiconductor layer in the electronic device of the invention, the process temperature in the production of the electronic device can be set to 200° C. or lower.

Accordingly, a TFT, for example, can be formed on a resin substrate to serve as an electronic device of the invention, and a flexible display can be prepared using the thus-obtained TFT substrate.

The resin substrate may be provided with, for example, at least one of a barrier layer preventing permeation of moisture or oxygen, an undercoat layer for improving flatness of the resin substrate or adhesion to a lower electrode, or another layer.

In the invention, the thickness of the substrate is preferably from 50 μm to 500 μm.

When the thickness of the substrate is 50 μm or more, the flatness of the substrate is more improved.

When the thickness of the substrate is 500 μm or less, flexibility of the substrate is more improved, and the use of the substrate as a substrate for a flexible display is facilitated.

Gate Electrode

A gate electrode 12 is formed on the substrate 10 (FIG. 3 (B)).

The material of the gate electrode 12 may be a material having electric conductivity and thermal resistance (500° C. or higher). Examples of materials that can be used for forming an electrically conductive film of the gate electrode 12 include metals such as Al, Mo, Cr, Ta, Ti, Au, and Ag; alloys such as Al—Nd and APC (trade name, manufactured by Furuya Metal Co., Ltd.; Ag alloy); and metal oxide electrically conductive films such as a conductive film of tin oxide, zinc oxide, indium oxide, indium tin oxide (ITO), or indium zinc oxide (IZO).

The structure of the gate electrode 12 may be a single layer structure consisting of an electrically conductive film, or may be a laminated structure (multi-layer structure) of two or more electrically conductive films; the electrically conductive film or the electrically conductive films may be selected from those described above.

The gate electrode 12 is formed on the substrate 10 by, for instance, a method appropriately selected in consideration of the suitability to the material that is used to form the gate electrode. Examples thereof include wet methods such as a printing method and a coating method; physical methods such as a vacuum deposition method, a sputtering method, and an ion plating method; and chemical methods such as CVD (chemical vapor deposition) and a plasma CVD method. The thickness of the gate electrode 12 is preferably from 10 nm to 1000 nm (more preferably from 50 nm to 200 nm).

For example, a Mo film, an Al film, an Al—Mo film, or a multilayer film composed of a combination thereof is formed by, for example, sputtering.

After the film formation, patterning by photolithography and etching is performed to give a predetermined shape. In this process, it is preferred that the patterning of the gate electrode 12 is performed simultaneously with the patterning of gate wires (not shown).

Gate Insulating Film

After forming the gate electrode 12 on the substrate 10, a gate insulating film 14 is formed (FIG. 3 (C)).

The gate insulating film 14 is a film having insulating property and thermal resistance (500° C. or higher). For example, the gate insulating film 14 may be an insulating film of $SiO_2$, $SiN_x$, $SiON$, $Al_2O_3$, $Y_2O_3$, $Ta_2O_5$, $HfO_2$, or the like or may be an insulating layer containing at least two of these compounds.

The gate insulating film 14 is formed on the substrate 10 by a method appropriately selected in consideration of the suitability to the material that is used to form the gate insulating film. Examples thereof include wet methods such as a printing method and a coating method; physical methods such as a vacuum deposition method, a sputtering method, and an ion plating method; and chemical methods such as CVD and a plasma CVD method. Then, patterning by a photolithography method and etching is performed to give a predetermined shape, as necessary.

Note that, the gate insulating film 14 should be thick enough to reduce the leak current and to improve the voltage resistance. However, when the gate insulating film 14 is too thick, a rise in drive voltage occurs. Although the thickness of the gate insulating film 14 is set in consideration of the material of the gate insulating film 14, the thickness of the gate insulating film 14 is preferably from 10 nm to 10 μm, more preferably from 50 nm to 1000 nm, particularly preferably from 100 nm to 400 nm.

Specifically, for example, the gate insulating film 14 may be formed by subjecting an insulating film which is formed from silicon oxide ($SiO_2$), silicon nitride ($SiN_x$), or the like and which has a thickness of from 100 to 400 nm to sputtering, CVD, or the like.

Active Layer (Semiconductor Layer)

After forming the gate insulating film 14, an IGZO film 16 including a first layer 16A, a third layer 16C, and a second layer 16B is formed (see FIG. 3(D)).

The IGZO film 16 is formed, for example, by sputtering or the like in such a manner that the Zn ratio takes an absolute maximum value inside the IGZO film; the absolute maximum value may simultaneously be a local maximum value, and the same applies hereinafter.

For example, three layers may be formed in such a manner that a layer having a thickness of 10 nm and a compositional ratio of metal elements In, Ga, and Zn (i.e., In:Ga:ZN) of 1.0:1.0:1.0, a layer having a thickness of 10 nm and a compositional ratio In:Ga:Zn of 1.0:1.0:2.0, and a layer having a thickness of 30 nm and a compositional ratio In:Ga:Zn of 1.0:1.0:1.0, are formed in this order.

In other words, for example, there may be formed a first layer 16A having an In:Ga:Zn ratio of 1.0:1.0:1.0 (thickness: 10 nm), a third layer 16C having an In:Ga:Zn ratio of 1.0:1.0: 2.0 (thickness: 10 nm), and a second layer 16B having an In:Ga:Zn ratio of 1.0:1.0:1.0 (thickness: 30 nm) in this order.

The total thickness of IGZO film 16 is preferably from about 30 nm to about 200 nm, and respective layers in the IGZO film are preferably formed by a series of consecutive film-forming processes without being exposed to the atmosphere.

The IGZO film may have a configuration in which the respective layers are not distinctly separated by interfaces. For example, the y value in the ratio, In:Ga:Zn=1.0:1.0:y, may continuously change in the thickness direction, so that the y distribution in the IGZO film takes an absolute maximum value inside the IGZO film; in this case, a region at which the value of y is at least 90% of the absolute maximum value of y is preferably located in a region ranging from 1 nm to 30 nm from the interface between the IGZO film 16 and the gate insulating film 14, as described above.

When film formation in which the metal element ratio is changed is performed by sputtering, the sputtering may be performed, for example, as follows. Specifically, co-sputtering may be performed using plural targets each selected from a Zn target, a Ga target or Zn target or a simple or complex oxide thereof, and the metal element ratio may be changed by adjusting the current applied to one or some of the targets, a shielding plate for one or some of the targets, or the like.

For example, the IGZO film 16 (active layer) having the above configuration may be formed by co-sputtering using an $InGaZnO_4$ target and a ZnO target in such a manner that a constant power of 200 W is applied to the $InGaZnO_4$ target, and the power applied to the ZnO target is changed within a range of from 0 to 60 W.

A distribution of y in the IGZO film 16 similar to the distribution d shown in FIG. 1 is obtained when, in the formation of the film, a constant electric power is applied to a ZnO target during the formation of each of the first layer 16A, the third layer 16C, and the second layer 16B, and the electric power applied is swiftly changed to a next predetermined value when completing the formation of one layer to start formation of the next layer. The formation of the film may alternatively be performed such that a constant electric power is applied to a ZnO target during the formation of each of the first layer 16A, the third layer 16C, and the second layer 16B, and such that the electric power applied is gradually changed when completing the formation of one layer to start formation of the next layer, as a result of which the y distribution becomes similar to the distribution e shown in FIG. 2. In the latter case, no distinct interfaces are formed between the respective layers.

Subsequently, the IGZO film 16 is patterned to form an active layer 18 including a first layer 18A, a third layer 18C, and a second layer 18B (FIG. 4 (A)). Here, the active layer 18 is formed to have a pattern of, for example, an island shape, so that the active layer 18 has an overlapping portion with the gate electrode 12 when viewed in the normal direction of the substrate 10.

Patterning of the IGZO film 16 may be performed by a photolithography and etching. Specifically, the IGZO film 16 provided on the gate insulating film 14 is patterned by providing a resist at portions that should remain as the active layer 18 by photolithography, and then etching the exposed portions of the IGZO film 16 with an acid solution such as hydrochloric acid, nitric acid, dilute sulfuric acid, or a mixed liquid of phosphoric acid, nitric acid, and acetic acid (AL ETCHANT, trade name, manufactured by Kanto Chemical Co., Ltd.), as a result of which the active layer 18 is formed. An aqueous solution including phosphoric acid, nitric acid, and acetic acid is a preferable example since the use thereof ensures removal of the exposed portions of the IGZO film 16.

Source Electrode and Drain Electrode

Next, a metal film for forming a source electrode 20A and a drain electrode 20B is formed on the active layer 18 and the gate insulating film 14.

The metal film may be formed in the same manner as in the preparation of the metal film of the gate electrode 12.

The metal film is preferably a Mo film, an Al film, an Al—Mo film, or a multilayer film composed of a combination thereof, each of which is formed by, for example, sputtering.

In light of film forming property, capability of patterning by etching or a lift-off, electric conductivity (reduction of electric resistance), and the like, it is preferred that the film thickness of the metal film is from 10 nm to 1000 nm, and more preferably from 50 nm to 100 nm.

Next, the metal film is subjected to patterning by etching or lift-off, whereby a source electrode 20A and a drain electrode 20B, each of which is in contact with the active layer 18, are formed (see FIG. 4 (B)).

The source electrode 20A and drain electrode 20B are each formed so as to have a portion overlapping the gate electrode 12 and the active layer 18 when viewed in the normal direction of the substrate 10.

It is preferable that the patterning of the source electrode and drain electrode is performed simultaneously with the patterning of wires (such as data wires) that are connected to the source electrode and of wires (such as data wires) that are connected to the drain electrode.

Inter-Layer Insulating Film

After forming the source electrode 20A, the drain electrode 20B, and the wires, an inter-layer insulating film 22 is formed (FIG. 4 (C)).

Examples of materials that can be used to form the inter-layer insulating film 22 include metal oxides such as MgO, SiO, $SiO_2$, $Al_2O_3$, GeO, NiO, CaO, BaO, $Fe_2O_3$, $Y_2O_3$, and $TiO_2$; metal nitrides such as $SiN_X$ and $SiN_xO_y$; metal fluorides such as $MgF_2$, LiF, $AlF_3$ and $CaF_2$; polyethylene; polypropylene; polymethyl methacrylate; polyimide; polyurea; polytetrafluoroethylene; polychlorotrifluoroethylene; polydichlorodifluoroethylene; copolymers of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymer main chain; water absorbing substances each having a coefficient of water absorption of 1% or higher; and moisture permeation preventive substances each having a coefficient of water absorption of 0.1% or lower.

The method of forming the inter-layer insulating film 22 is not particularly limited. Examples of the method include a vacuum deposition method, a sputtering method, a reactive sputtering method, a molecular beam epitaxy (MBE) method, a cluster ion beam method, an ion plating method, a plasma polymerization method (a radio frequency ion plating method), a plasma chemical vapor deposition (CVD) method, a laser CVD method, a thermal CVD method, a gas source CVD method, a coating method, a printing method, and a transferring method, and the method may be selected depending on the material.

The thickness of the inter-layer insulating film 22 is usually from 50 nm to 10,000 nm, depending on the material or the like.

Specifically, for example, the inter-layer insulating film 22 may be an insulating film of silicon oxide ($SiO_2$), silicon nitride ($SiN_x$), or the like having a thickness of from 100 nm to 200 nm, which may be formed by, for example, sputtering or CVD.

Pixel Electrode

Subsequent to the formation of inter-layer insulating film 22, a contact hole 24 is formed to penetrate through the inter-layer insulating film 22 by photolithography and etching (or lift-off), and a pixel electrode 26 and the like are then formed (see FIG. 4(D)).

For example, after a film of indium tin oxide (ITO) is formed by sputtering, the film may be patterned by photolithography and etching (or lift-off), whereby a patterned pixel electrode 26, which connects to the drain electrode 20B through the contact hole 24, is obtained.

Other than the ITO used in the above description, the pixel electrode 26 may alternatively be formed from Al, Al—Nd, or the like.

The TFT described above has a Zn-rich region (region in which the Zn molar ratio is high) in a part of the active layer 18 (the third layer 18C); therefore, characteristics shift is reduced while a high on-state current is achieved.

Since the characteristics shift is reduced, the gate bias required to get the TFT to be in the off-state can be reduced, and electrical consumption for driving the TFT can be reduced.

The TFT described above is a bottom-gate top-contact TFT among bottom-gate TFTs. However, a bottom-gate bottom-contact TFT can be obtained by changing the order of formation of the active layer 18, the source electrode 20A, and the drain electrode 20B (i.e., changing the layer configuration) in the TFT.

Some embodiments of the invention are described in the above; however, the invention is not limited to these embodiments.

For example, at least one of the inter-layer insulating film 22 or the pixel electrode 26 may be omitted.

Figure 5:
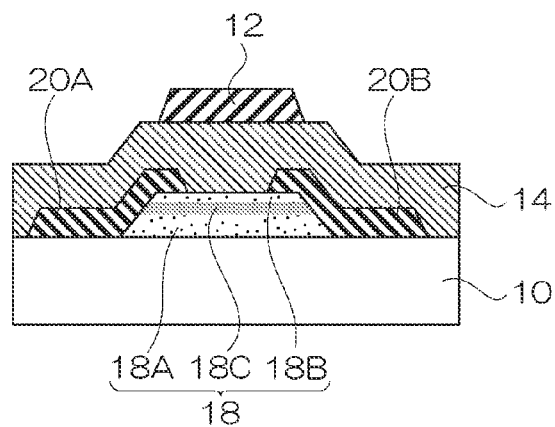
FIG. 5 is a schematic diagram showing an example of a top-gate thin film transistor.

Furthermore, the invention is not limited to a bottom-gate TFT, and may be applied to a top-gate TFT having a configuration as shown in FIG. 5, for example. When the invention is applied to a top-gate TFT having a configuration as shown in FIG. 5, an IGZO film may be formed on a substrate 10, and subjected to patterning to form an active layer 18, and a source electrode 20A and a drain electrode 20B may be formed thereon, followed by forming a gate insulating film 14 and a gate electrode 12 in this order.

The IGZO film preferably includes a first layer, a second layer, and a third layer (which respectively correspond to the first layer 18A, the second layer 18B, and the third layer 18C in the active layer 18 shown in FIG. 5), similar to the IGZO film in the bottom-gate TFT.

It is preferable that the center, in the thickness direction, of a region at which the absolute maximum y value over the y distribution is positioned at a side closer to the gate insulating film with respect to the center of the IGZO film (active layer 18) in the thickness direction. In a specific example of such an embodiment, a first layer 18A in which In:Ga:Zn ratio is 1.0:1.0:1.0 (thickness: 30 nm), a third layer 18C in which In:Ga:Zn ratio is 1.0:1.0:2.0 (thickness: 10 nm), and a second layer 18B in which In:Ga:Zn ratio is 1.0:1.0:1.0 (thickness: 10 nm) are provided in this order on a substrate 10.

As described above, the TFT described above by referring to FIG. 5 is a top-gate top-contact TFT among top-gate TFTs.

However the TFT of the invention can be made to be a top-gate bottom-contact TFT by changing the order of formation of the active layer 18, the source electrode 20A, and the drain electrode 20B (i.e., changing the layer configuration).

The application of the thin film transistor of the invention is not particularly limited. The thin film transistor of the invention is preferably used, for example, for a driving device of electrooptic apparatuses (such as liquid crystal display devices, organic electroluminescence (EL) display devices, or inorganic EL display devices).

Furthermore, the electronic device of the invention is preferably used for a driving device (driving circuit) of various electronic devices such as devices which can be prepared by a low-temperature process using a resin substrate (such as flexible displays), various sensors such as X-ray sensors, and micro electro mechanical systems (MEMS).

Electrooptic Apparatus and Sensor

The electrooptic apparatus of the invention and the sensor of the invention each include the above-described thin film transistor of the invention.

Examples of the electrooptic apparatus include display apparatuses such as liquid crystal display apparatuses, organic electroluminescence (EL) display apparatuses, and inorganic EL display apparatuses.

Examples of the sensor include image sensors such as charge coupled devices (CCDs) and complementary metal oxide semiconductors (CMOSs) and X-ray sensors.

Since the electrooptic apparatus or sensor of the invention includes the thin film transistor of the invention, which exhibits a high on-state current and reduced characteristics shift, the electrooptic apparatus or sensor exhibits excellent properties with low electrical consumption.

Here, the "properties" refer to the display properties when used in connection with an electrooptic apparatus, and refer to the sensitivity properties when used in connection with a sensor.

Figure 6:
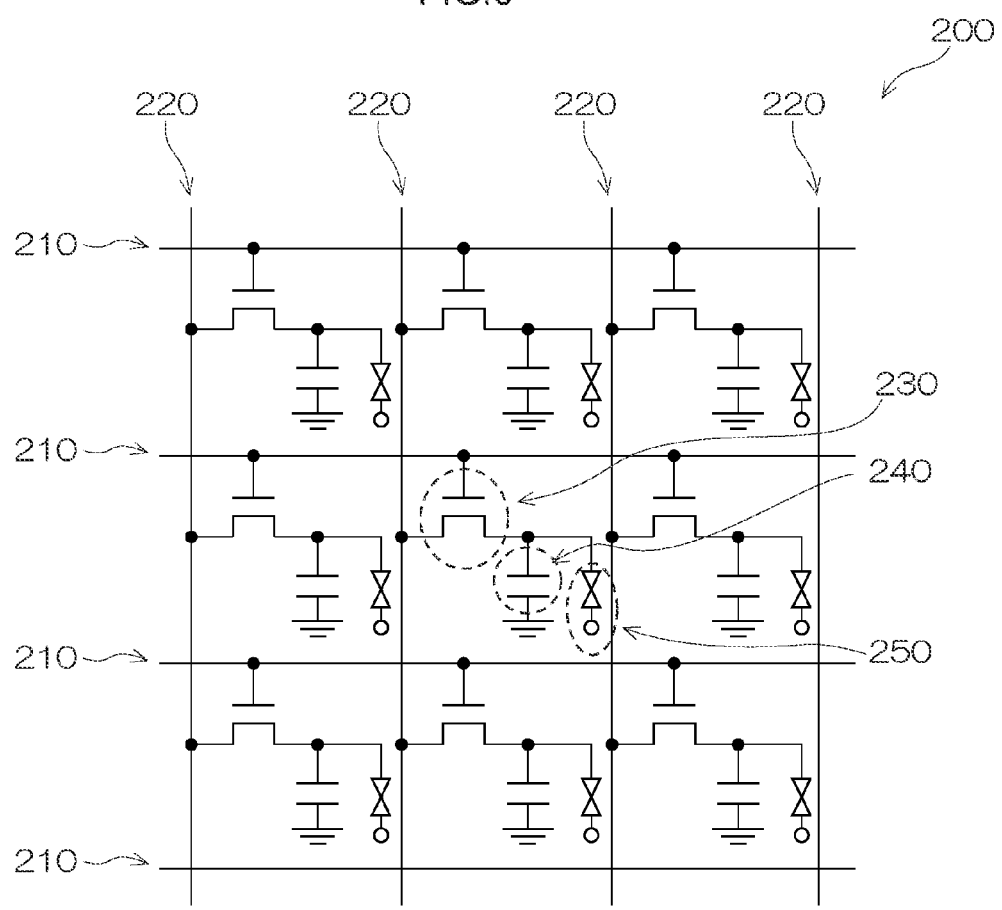
FIG. 6 is a schematic diagram showing a liquid crystal display device which is an example of an electrooptic apparatus of the invention.

FIG. 6 is a conceptual diagram illustrating a liquid crystal display 200, which is an example of the display of the invention.

As shown in FIG. 6, the liquid crystal display 200 is equipped with plural gate wires 210 which are parallel to each other and plural data wires 220 which are parallel to each other. The data wires 220 and the gate wires 210 are placed in such a manner that the data wires 220 are intersected with the gate wires 210. Here, the gate wires 210 are electrically insulated from the data wires 220. A thin film transistor (TFT) 230, which is a thin film transistor of the invention, is disposed in a portion at or around an intersection of a gate wire 210 and a data wire 220.

A gate electrode of the thin film transistor 230 is connected to the gate wire 210, and a source electrode of the thin film transistor 230 is connected to the data wire 220. Further, a drain electrode of the thin film transistor 230 is connected to a pixel electrode. A liquid crystal 250 is held between the pixel electrode and an opposing electrode (not shown). Moreover, the pixel electrode and an earthed opposing electrode form a condenser 240.

Since the TFT 230 exerts a high carrier mobility and a high on/off ratio, high-quality properties including high fineness, high-speed response, high contrast and the like are imparted to the liquid crystal display device 200. When the IGZO used in the active layer is amorphous, variations of device properties can be suppressed, whereby unevenness can be suppressed and excellent display quality can be achieved even in a large-size display. In addition, since the characteristics shift is reduced, the gate bias can be reduced, and electrical consumption of a display device can be reduced.

According to the invention, a semiconductor layer can be prepared using an IGZO film which is capable of film formation at low temperatures (for example, at 200° C. or less) to produce the thin film transistor 230. Therefore, a resin substrate (plastic substrate) can be used as the substrate.

According to the invention, a flexible liquid crystal display device having an excellent display quality, and a flexible organic EL device having excellent display quality can be provided.

Figure 7:
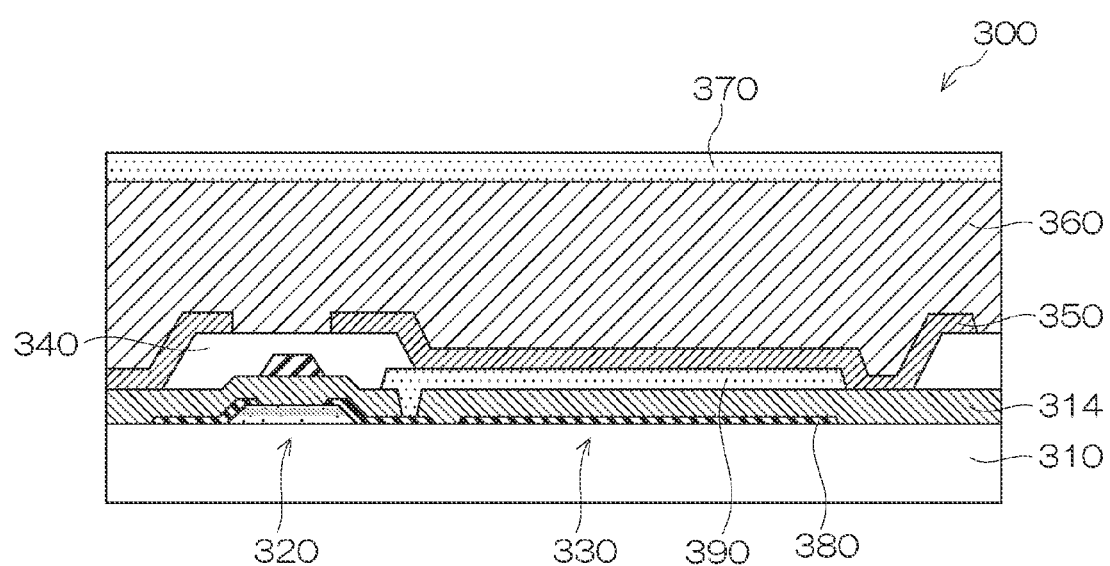
FIG. 7 shows a conceptual sectional view of an X-ray sensor which is an example of a sensor of the invention.

FIG. 7 is a conceptual sectional view illustrating an X-ray sensor 300, which is an example of the sensor of the invention. More specifically, FIG. 7 is a magnified conceptual sectional view showing a part of an X-ray sensor array.

As shown in FIG. 7, the X-ray sensor 300 includes a substrate 310, a TFT 320 and a capacitor 330 which are disposed on a substrate 310, an electric charge-collecting electrode 350 which is disposed on the capacitor 330, an X-ray conversion layer 360, and an upper layer electrode 370.

In FIG. 7, the TFT 320 is a top-gate TFT similar to the TFT shown in FIG. 5; however, the TFT in the sensor of the invention is not limited to a top-gate TFT and may be a bottom-gate TFT.

A passivation film 340 is provided on the TFT 320.

The capacitor 330 has a configuration in which an insulating film 314 is interposed between a capacitor-lower electrode 380 and a capacitor-upper electrode 390. The material of the capacitor-lower electrode 380 is the same as the material of a source electrode and drain electrode of the TFT 320. The capacitor-lower electrode 380 is formed by patterning simultaneously with patterning of the source electrode and drain electrode of the TFT 320. The capacitor-upper electrode 390 is connected to either one of the source electrode or drain electrode of the TFT 320 through a contact hole that is provided to penetrate through the insulating film 314.

The electric charge-collecting electrode 350 is provided on the capacitor-upper electrode 390 in the capacitor 330, and is in contact with the capacitor-upper electrode 390.

The X-ray conversion layer 360 is a layer including amorphous selenium, and is provided over the TFT 320 and the capacitor 330.

The upper layer electrode 370 is provided on the X-ray conversion layer 360, and is in contact with the X-ray conversion layer 360.

In the X-ray sensor 300 having the above configuration, X-rays are irradiated from the upper part in FIG. 7 (from the upper layer electrode 370 side), and electron-hole pairs are generated in the X-ray conversion layer 360. When a high electrical field is applied to the X-ray conversion layer 360 by the upper electrode 370, the generated charges are accumulated in the capacitor 330, and read out by sequentially scanning the TFT 320.

In the X-ray sensor 300, the highly reliable TFT 320 is provided which exhibits a high on-state current and a reduced characteristics shift; therefore, the X-ray sensor 300 has a high S/N ratio and excellent sensitivity, and high dynamic range images can be obtained. Furthermore, when the IGZO in the active layer of the TFT 320 is amorphous, highly uniform images can be obtained.

EXAMPLES

In the following, the present invention is further described in detail with reference to examples. However, the examples should not be construed as limiting the present invention. Unless otherwise noted, "part(s)" and "%" are on the mass basis.

Example 1

Production of Bottom-Gate TFT

A bottom-gate TFT was prepared in accordance with the above-described example of a method of producing a thin film transistor (FIGS. 3 and 4).

Here, an alkali-free glass substrate (trade name: No. 1737, manufactured by Corning Inc.) was used as a substrate 10.

First, an Al—Nd film having a thickness of 100 nm was formed by sputtering, and then was subjected to patterning by photolithography and wet etching using a commercially-available Al etching liquid, thereby forming a gate electrode 12.

Then, a gate insulating film 14 having a thickness of 150 nm was formed by sputtering $SiO_2$.

Subsequently, a layer having an In:Ga:Zn ratio of 1.0:1.0:1.0 (thickness: 10 nm), a layer having an In:Ga:Zn ratio of 1.0:1.0:2.0 (thickness: 10 nm), and a layer having an In:Ga:Zn ratio of 1.0:1.0:1.0 (thickness: 30 nm) were formed on the gate insulating film 14 in this order by a series of consecutive film-forming processes without being exposed to the atmosphere, thereby forming an IGZO film 16.

Hereinafter, the layer configuration of the IGZO film 16 (active layer 18) of Example 1 may be represented by "In:Ga:Zn=1:1: (1→2→1)" or "1→2→1".

The layers of the IGZO film were formed by co-sputtering using an $InGaZnO_4$ target, a $Ga_2O_3$ target, and a ZnO target.

The thicknesses of the respective layers were adjusted by controlling the duration of the film-forming processes.

Details of the sputtering conditions for forming the IGZO film 16 were described in the following.

Sputtering conditions for forming IGZO Film (In:Ga:Zn=1.0:1.0:1.0)

Final vacuum degree (when gas is not introduced): $6\times10^{-6}$ Pa

Film-forming pressure (when gas is introduced): $4.07\times10^{-1}$ Pa

Film-forming temperature: room temperature (substrate temperature: from 23° C. to 25° C.)

Flow rate of Ar: 100 sccm

Flow rate of $O_2$: 0.9 sccm

Power applied to IGZO target: RF 200 W

Power applied to $Ga_2O_3$ target: RF 63 W

Power applied to ZnO target: DC 4.3 W

Sputtering conditions for forming IGZO film (In:Ga:Zn=1.0:1.0:2.0)

Final vacuum degree (when gas is not introduced): $6\times10^{-6}$ Pa

Film-forming pressure (when gas is introduced): $4.07\times10^{-1}$ Pa

Film-forming temperature: room temperature (substrate temperature: from 23° C. to 25° C.)

Flow rate of Ar: 100 sccm

Flow rate of $O_2$: 0.9 sccm

Power applied to IGZO target: RF 200 W

Power applied to $Ga_2O_3$ target: RF 63 W

Power applied to ZnO target: DC 19.0 W

The y distribution in the thickness direction of the resultant IGZO film 16, when the molar ratio of In:Ga:Zn is represented by the following expression In:Ga:Zn=(2.0−x):x:y (provided that, 0.0<x<2.0, and 0.0<y), was determined in a such a manner that a sample was subjected to FIB treatment and evaluated by cross-sectional TEM-EDX (a TEM available under the trade name of HD-2700 from Hitachi, and an EDX available from EDAX under the trade name of GENESIS). The evaluation conditions were such that: a beam diameter was 0.4 nm, measurement time per one point was 1 second, and the number of measurement points was 150.

The obtained y distribution confirmed the presence a region in which the value of y is larger than that at a surface of the IGZO film at a side closer to the substrate and that at a surface of the IGZO film at a side farther from the substrate.

The obtained y distribution was similar to the distribution d shown in FIG. 1.

The thickness $t_{max}$ of a region at which the value of y is at least 90% of the absolute maximum y value within the IGZO film was 10 nm, and was less than one-third of the entire thickness of the IGZO film, which was 50 nm.

Furthermore, the region at which the y value is at least 90% of the absolute maximum y value over the y distribution was present in a region ranging from 10 nm to 20 nm from the surface of the gate-insulating-film side of the IGZO film in the thickness direction thereof, and included in the region ranging from 1 nm to 30 nm from the surface of the gate-insulating-film side of the IGZO film.

The center, in the thickness direction, of the region at which the y value was at least 90% of the absolute maximum y value was positioned at a side closer to the gate insulating film with respect to the center of the oxide semiconductor film in the thickness direction.

The IGZO film 16 was subjected to X-ray diffraction. As a result, no distinct peak indicating a crystalline structure was found, and it was confirmed that the IGZO film 16 was amorphous.

A TFT can be prepared by a similar process in which the power applied to the ZnO target during the sputtering for the formation of the IGZO film 16 is continuously changed from 4.3 W to 19.0 W when starting the formation of the center layer and is continuously changed from 19.0 W to 4.3 W when finishing the formation of the center layer, instead of forming three distinct layers. When a TFT produced by such a process was subjected to analysis of y distribution in the same manner as above, it was found that the TFT had a y distribution similar to the distribution curve "e" shown in FIG. 2.

The IGZO film 16 was subjected to patterning by photolithography and wet etching using dilute sulfuric acid, thereby forming the active layer 18.

An Al—Nd film having a thickness of 100 nm was formed by sputtering, and subjected to patterning by lift-off, thereby forming a source electrode 20A and a drain electrode 20B.

A $SiO_2$ film having a thickness of 200 nm was formed by sputtering, thereby forming an inter-layer insulating film 22.

A contact hole 24 was formed by photolithography and dry etching.

An ITO film having a thickness of 200 nm was formed by sputtering, and subjected to patterning by lift-off, thereby forming a pixel electrode 26.

In this way, a bottom-gate TFT having a channel length of 10 μm and a channel width of 10 μm was obtained.

Measurement of Transistor Properties (Vd-Ig Characteristics)

The thus-obtained TFT was subjected to measurement of transistor properties (Vg-Id characteristics) and carrier mobility (μ) using a semiconductor parameter analyzer 4156C (trade name, manufactured by Agilent Technologies).

The Vg-Id characteristics were measured by changing the gate voltage (Vg) within a range of from −5 V to +10 V with a fixed drain voltage (Vd) of 5 V, and measuring the drain current (Id) at each gate voltage (Vg).

Comparative Example 1

A TFT was prepared in the same manner as in Example 1 except that the IGZO film 16 was composed of only the layer having an In:Ga:Zn ratio of 1.0:1.0:1.0 and having a thickness of 50 nm, and the same evaluation as in Example 1 was performed.

In the following, the layer configuration of the IGZO film 16 (active layer 18) of Comparative Example 1 may be referred to as "In:Ga:Zn=1:1:1" or "1→1→1".

Comparative Example 2

A TFT was prepared in the same manner as in Example 1 except that the IGZO film 16 was composed of only the layer having an In:Ga:Zn ratio of 1.0:1.0:2.0 and having a thickness of 50 nm, and the same evaluation as in Example 1 was performed.

In the following, the layer configuration of the IGZO film 16 (active layer 18) of Comparative Example 2 may be referred to as "In:Ga:Zn=1:1:2" or "2→2→2→".

Figure 8:
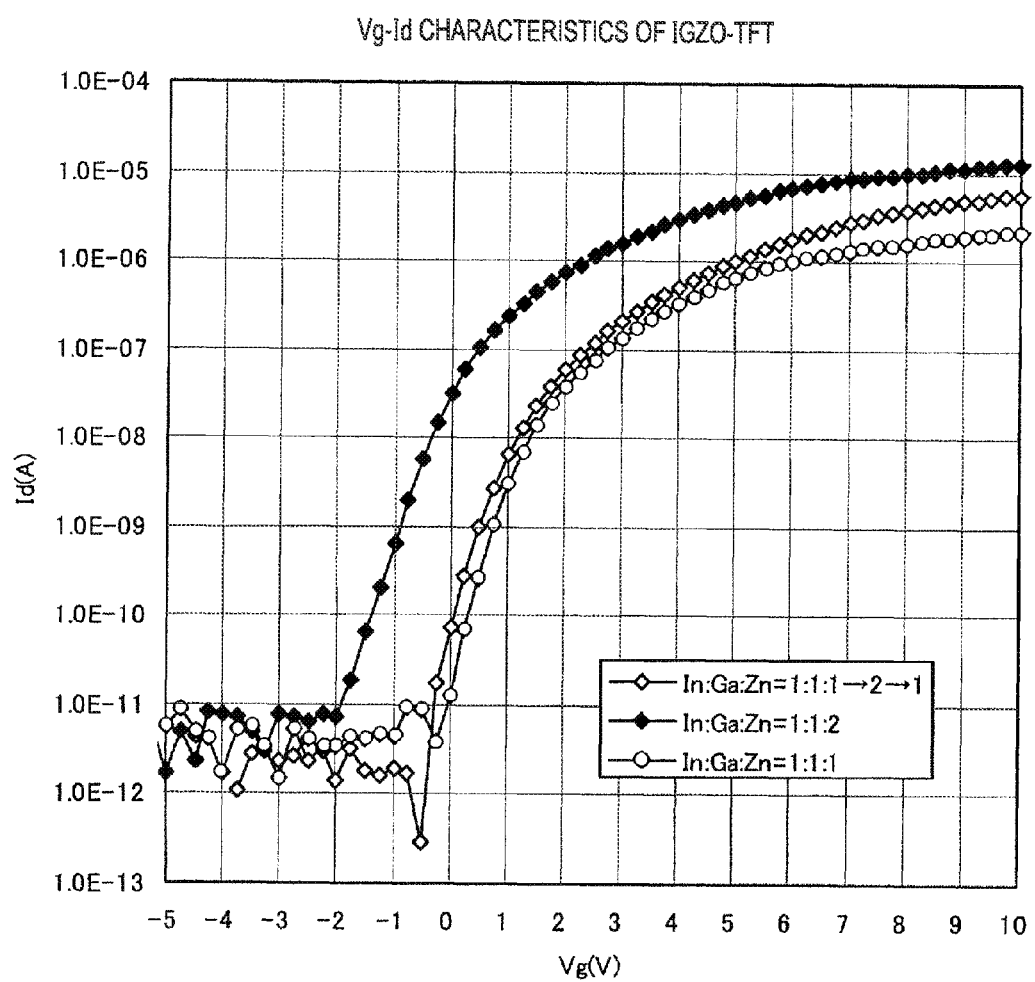
FIG. 8 shows the results of measurements of transistor properties (Vg-Id characteristics) measured in the Examples of the invention.
Figure 9:
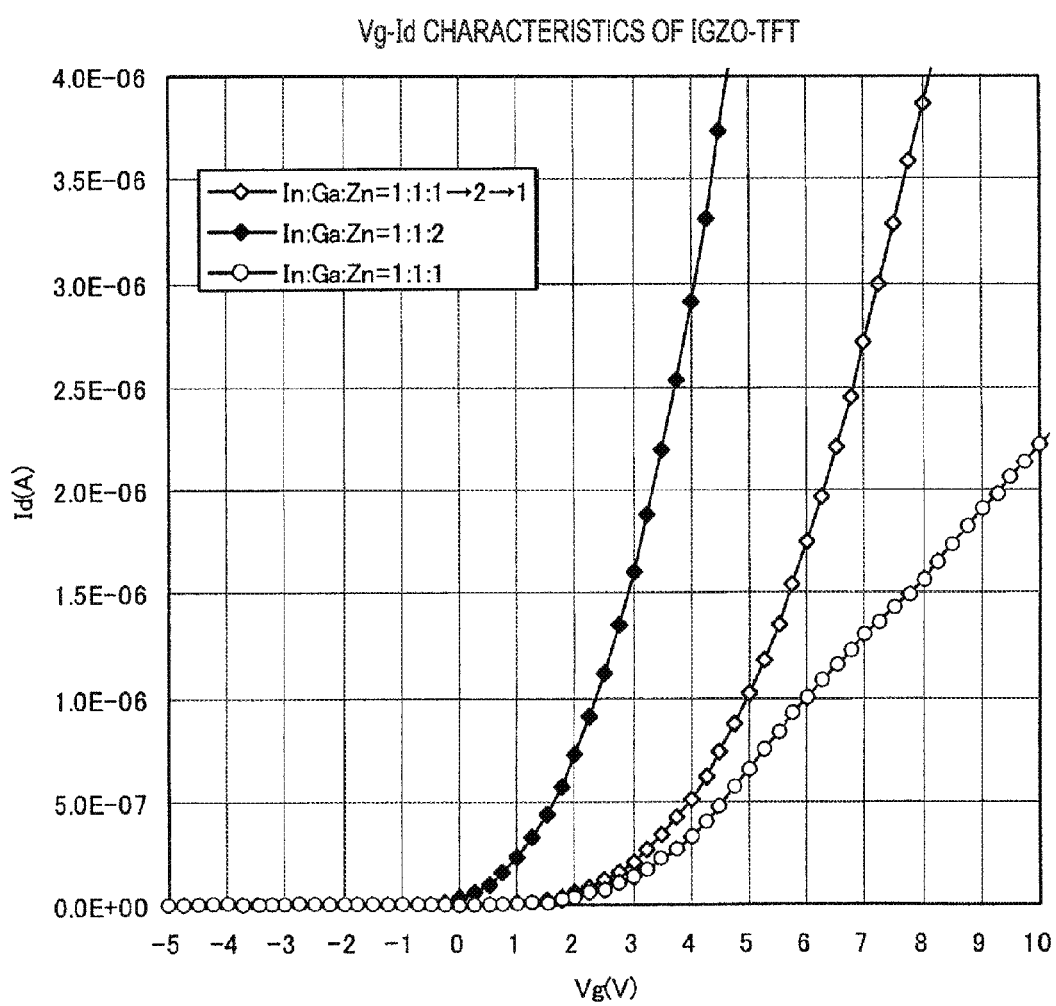
FIG. 9 shows the results of measurements of transistor properties (Vg-Id characteristics) measured in the Examples of the invention.

The results of measurement of Vg-Id characteristics of Example 1 and Comparative Examples 1 and 2 are shown in FIGS. 8 and 9.

FIG. 8 is a graph in which the vertical axis represents Id on a logarithmic scale, and FIG. 9 is a graph in which the vertical axis represents Id on a linear scale.

As shown in FIG. 8, when Example 1 (In:Ga:Zn=1:1:(1→2→1)) is compared to Comparative Example 1 (In:Ga:Zn=1:1:1), almost no shift in Vg-Id characteristics is observed in Example 1. For example, when the value at Id of $1.0 \times 10^{-9}$ A of Example 1 is compared to that of Comparative Example 1, the shift of Vg from Comparative Example 1 observed in Example 1 is about 0.3 V towards the negative Vg side, which is a slight shift.

Furthermore, provided that Id at Vg of 10 V is regarded as the on-state current, the on-state current in Comparative Example 1 was $2.0 \times 10^{-6}$ A, while the on-state current in Example 1 was $6.0 \times 10^{-6}$ A.

In addition, the carrier mobility μ in Comparative Example 1 was 7.9 ($cm^2$/Vs) while the carrier mobility μ in Example 1 was 24.7 ($cm^2$/Vs).

Accordingly, the TFT of Example 1 showed significantly higher on-state current and significantly improved carrier mobility as compared to the TFT of Comparative Example 1.

On the other hand, Comparative Example 2 (In:Ga:Zn=1:1:2) showed a high on-state current, but significant Vg-Id characteristics shift was observed as compared with Example 1 and Comparative Example 1.

For example, when the value at Id of $1.0 \times 10^{-9}$ A of Comparative Example 2 is compared to that of Example 1 and that of Comparative Example 1, the shift of Vg from Comparative Example 1 observed in Comparative Example 2 is at least 1.5 V towards the negative Vg side, and the shift of Vg from Example 1 observed in Comparative Example 2 is at least 1.3 V towards the negative Vg side, which is a significant shift.

Example 2

A TFT was prepared in the same manner as in Example 1 except that the layer having an In:Ga:Zn ratio of 1.0:1.0:2.0 (thickness: 10 nm) was changed to a layer having an In:Ga:Zn ratio of 1.0:1.0:3.0 (thickness: 10 nm) by controlling the film formation conditions, and the measurement of Vg-Id characteristics and carrier mobility and the evaluation were performed in the same manner as in Example 1.

In the following, the layer configuration of the IGZO film 16 (active layer 18) of Example 2 may be referred to as "In:Ga:Zn=1:1: (1→3→1)" or "1→3→1".

Example 3

A TFT was prepared in the same manner as in Example 1 except that the layer having an In:Ga:Zn ratio of 1.0:1.0:2.0

(thickness: 10 nm) was changed to a layer having an In:Ga:Zn ratio of 1.0:1.0:5.0 (thickness: 10 nm) by controlling the film formation conditions, and the measurement of Vg-Id characteristics and carrier mobility, and the evaluation were performed in the same manner as in Example 1.

In the following, the layer configuration of the IGZO film 16 (active layer 18) of Example 3 may be referred to as "In:Ga:Zn=1:1: (1→5→1)" or "1→5→1".

Figure 10:
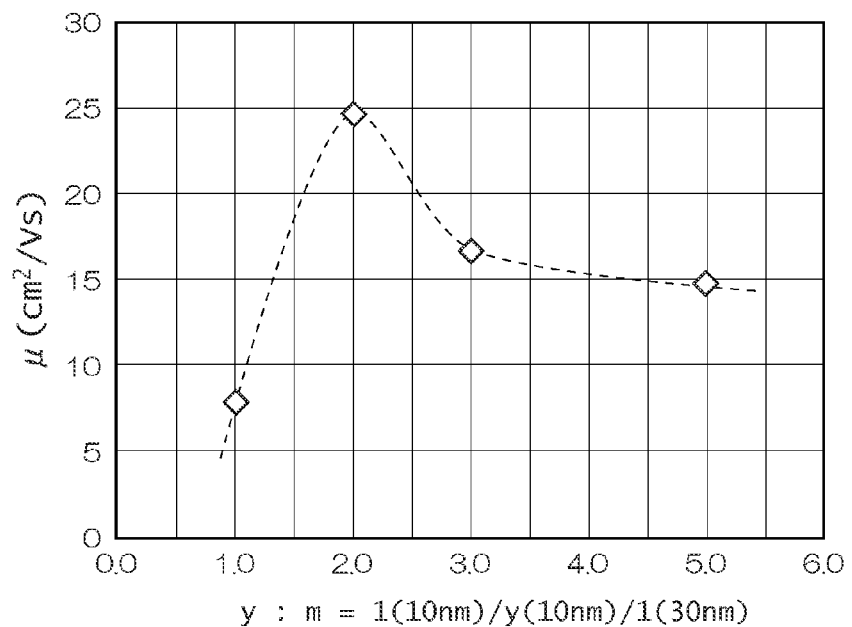
FIG. 10 is a diagram showing a comparison in carrier mobility of Examples 1, 2, and 3 and Comparative Example 3.
Figure 11:
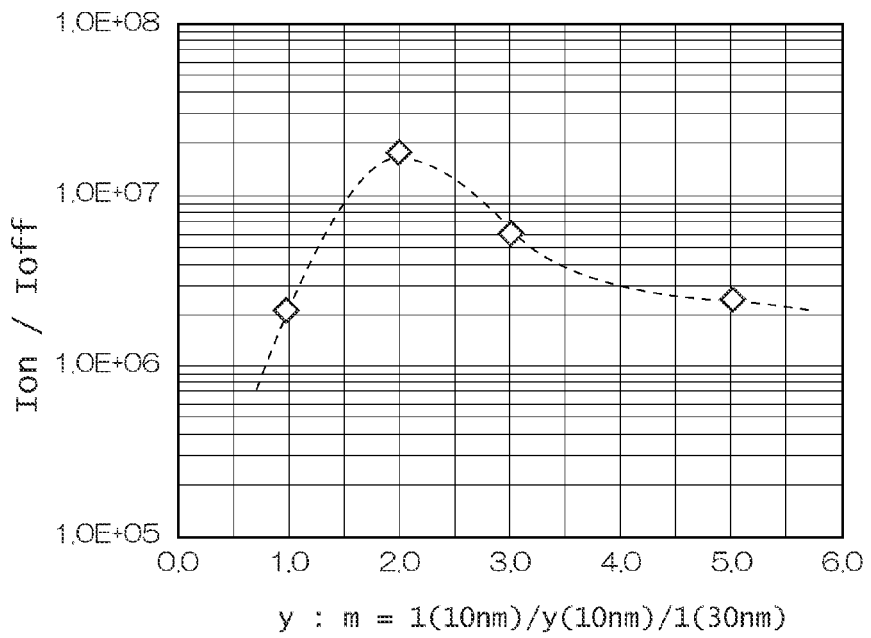
FIG. 11 is a diagram showing a comparison in on/off ratios (i.e., ratios of on-state current/off-state current) of Examples 1, 2, and 3 and Comparative Example 3.

FIG. 10 shows a comparison in carrier mobility of Examples 1 to 3 and Comparative Example 1, and FIG. 11 shows a comparison in on/off ratio (on-state current (Ion)/off-state current (Ioff)) of Examples 1 to 3 and Comparative Example 1.

The on-state current was a drain current (A) at Vg of 10 V and Vd of 5 V, and the off-state current was a drain current (A) at Vg of −5V and Vd of 5 V.

Each of the horizontal axes of FIGS. 10 and 11 indicates the y value in the center layer (the third layer 18C shown in FIG. 4(D)). In FIGS. 10 and 11, Comparative Example 1 is plotted at y=1.0, Example 1 is plotted at y=2.0, Example 2 is plotted at y=3.0, and Example 3 is plotted at y=5.0.

Herein (for example, in Table 1 and FIGS. 8, 9 and 11), the symbol "E" when used in the values of Id and on/off ratio indicates that the numeral at the right of "E" is an exponent to the base 10, and that the value at the left of "E" is multiplied by the value represented by "E" and "power index". For example, "1.8E+07" represents "$1.8 \times 10^7$", and "1.5E−09" represents "$1.5 \times 10^{-9}$".

The results shown in FIGS. 10 and 11 are briefly summarized in Table 1. Furthermore, Table 1 shows the drain current ("Id (A) (Vg=0 v)") at Vg of 0 V.

TABLE 1

| | Layer configuration of active layer: y value | Carrier mobility μ (cm²/Vs) | On/off ratio (Ion/Ioff) | Id (A) (Vg = 0 V) |
|---|---|---|---|---|
| Example 1 | 1→2→1 | 24.7 | 1.8E+07 | 1.8E−10 |
| Example 2 | 1→3→1 | 16.6 | 6.0E+06 | 1.5E−09 |
| Example 3 | 1→5→1 | 14.8 | 2.4E+06 | 1.3E−08 |
| Comparative Example 1 | 1→1→1 | 7.9 | 2.1E+06 | 4.4E−11 |
| Comparative Example 2 | 2→2→2 | 23.4 | 1.5E+07 | 5.3E−08 |

As shown in FIG. 10 and Table 1, the carrier mobility μ in Examples 1 to 3 (especially, Example 1) was higher than that in Comparative Example 1.

As shown in FIG. 11 and Table 1, the on/off ratio in Examples 1 to 3 (especially, Example 1) was higher than that in Comparative Example 1.

Furthermore, as shown in Table 1, the Id at Vg of 0 V in Examples 1 to 3 (especially, Example 1) was lower than that in Comparative Example 2, and characteristics shift in Examples 1 to 3 (especially, Example 1) was reduced as compared to Comparative Example 2.

As described above, when an IGZO layer as an active layer of a TFT is formed so as to have a region at which the y value is larger than that at the film surface at a side closer to a substrate and that at the film surface at a side farther from the substrate, characteristics shift can be reduced while a high on-state current (high carrier mobility) can be attained, whereby gate bias applied in order to turn off the TFT can be reduced. Accordingly, a normally-off TFT can easily be obtained while attaining a sufficient on-state current. Furthermore, since the gate bias is reduced, electrical consumption required to drive the TFT can be reduced.

Moreover, by using, as a component, the TFT (or substrate with a TFT) prepared as described above, an electrooptic apparatus or sensor with low electrical consumption and excellent properties can be produced.

According to the invention, a thin film transistor which has a high on-state current and in which characteristics shift is reduced, and a method of producing the same are provided.

According to the invention, an electrooptic apparatus with low electrical consumption and high display quality is provided.

According to the invention, a sensor with low electrical consumption and high sensitivity is provided.

Embodiments of the present invention include, but are not limited to, the following.

<1> A thin film transistor comprising:
a substrate; and, on the substrate,
an oxide semiconductor film which serves as an active layer and comprises In, Ga, and Zn, a gate electrode, a gate insulating film, a source electrode, and a drain electrode,
wherein, when a molar ratio of In, Ga, and Zn in the oxide semiconductor film is expressed as In:Ga:Zn=(2.0−x):x:y, wherein 0.0<x<2.0 and 0.0<y, the distribution of y in the thickness direction of the oxide semiconductor film is such that the oxide semiconductor film has a region in which a value of y is larger than that at a surface of the oxide semiconductor film at a side closer to the substrate and larger than that at a surface of the oxide semiconductor film at a side farther from the substrate.

<2> The thin film transistor according to <1>, wherein an absolute maximum value of y over an entire thickness of the oxide semiconductor film is 1.8 or more.

<3> The thin film transistor according to <1> or <2>, wherein the absolute maximum value of y over the entire thickness of the oxide semiconductor film is 5.0 or less.

<4> The thin film transistor according to any one of <1> to <3>, wherein a thickness of a region in which the value of y is at least 90% of the absolute maximum value thereof over the entire thickness of the oxide semiconductor film is less than one-third of the entire thickness of the oxide semiconductor film.

<5> The thin film transistor according to any one of <1> to <4>, wherein a center of the region in which the value of y is at least 90% of the absolute maximum value thereof over the entire thickness of the oxide semiconductor film is located at a position at a side closer to the gate insulating film than the center of the oxide semiconductor layer in the thickness direction thereof.

<6> The thin film transistor according to any one of <1> to <5>, wherein the region in which the value of y is at least 90% of the absolute maximum value thereof over the entire thickness of the oxide semiconductor film is included in a region ranging from 1 nm to 30 nm from the surface of the oxide semiconductor film at a side closer to the gate insulating film in a thickness direction of the oxide semiconductor film.

<7> The thin film transistor according to any one of <1> to <6>, wherein at least a part of the oxide semiconductor film which includes the region in which the value of y is at least 90% of the absolute maximum value thereof over the entire thickness of the oxide semiconductor film is formed by a series of consecutive film-forming processes during which the semiconductor film is not exposed to the atmosphere.

<8> The thin film transistor according to any one of <1> to <7>, wherein at least a part of the oxide semiconductor film which includes the region in which the value of y is at least 90% of the absolute maximum value thereof over the entire thickness of the oxide semiconductor film is amorphous.

<9> The thin film transistor according to any one of <1> to <8>, wherein the oxide semiconductor film comprises:
  a first region which includes the surface of the oxide semiconductor film at a side closer to the substrate and in which the value of y is from 0.8 to 1.2;
  a second region which includes the surface of the oxide semiconductor film at a side farther from the substrate and in which the value of y is from 0.8 to 1.2; and
  a third region which includes a region in which y takes the absolute maximum value over the entire thickness of the oxide semiconductor film and in which the value of y is 1.8 or more.

<10> The thin film transistor according to <9>, wherein at least one of a change in the value of y from the first region to the third region and a change in the value of y from the third region to the second region is continuous.

<11> The thin film transistor according to any one of <1> to <10>, wherein the thin film transistor is a bottom-gate thin film transistor.

<12> A method of producing the thin film transistor according to any one of <1> to <11>, the method comprising:
  forming at least a part of the oxide semiconductor film which includes the region in which the value of y is at least 90% of the absolute maximum value thereof over the entire thickness of the oxide semiconductor film by a series of consecutive film-forming processes during which the oxide semiconductor film is not exposed to the atmosphere.

<13> An electrooptic apparatus comprising the thin film transistor according to any one of <1> to <11>.

<14> A sensor comprising the thin film transistor according to any one of <1> to <11>.

All publications, patent applications, and technical standards mentioned in this specification are herein incorporated by reference to the same extent as if each individual publication, patent application, or technical standard was specifically and individually indicated to be incorporated by reference.

What is claimed is:

1. A thin film transistor comprising:
  a substrate; and, on the substrate,
  an oxide semiconductor film which serves as an active layer and comprises In, Ga, and Zn, a gate electrode, a gate insulating film, a source electrode, and a drain electrode,
  wherein, when a molar ratio of In, Ga, and Zn in the oxide semiconductor film is expressed as In:Ga:Zn=(2.0−x):x:y, wherein $0.0<x<2.0$ and $0.0<y$, the distribution of y in the thickness direction of the oxide semiconductor film is such that the oxide semiconductor film has a region in which a value of y is larger than that at a surface of the oxide semiconductor film at a side closer to the substrate and larger than that at a surface of the oxide semiconductor film at a side farther from the substrate.

2. The thin film transistor according to claim 1, wherein an absolute maximum value of y over an entire thickness of the oxide semiconductor film is 1.8 or more.

3. The thin film transistor according to claim 1, wherein an absolute maximum value of y over an entire thickness of the oxide semiconductor film is 5.0 or less.

4. The thin film transistor according to claim 1, wherein a thickness of a region in which the value of y is at least 90% of an absolute maximum value thereof over an entire thickness of the oxide semiconductor film is less than one-third of the entire thickness of the oxide semiconductor film.

5. The thin film transistor according to claim 1, wherein a center of a region in which the value of y is at least 90% of an absolute maximum value thereof over an entire thickness of the oxide semiconductor film is positioned at a side closer to the gate insulating film than the center of the oxide semiconductor layer in a thickness direction thereof.

6. The thin film transistor according to claim 1, wherein a region in which the value of y is at least 90% of an absolute maximum value thereof over an entire thickness of the oxide semiconductor film is included in a region ranging from 1 nm to 30 nm from a surface of the oxide semiconductor film at a side closer to the gate insulating film in a thickness direction of the oxide semiconductor film.

7. The thin film transistor according to claim 1, wherein at least a part of the oxide semiconductor film which includes a region in which the value of y is at least 90% of an absolute maximum value thereof over an entire thickness of the oxide semiconductor film is formed by a series of consecutive film-forming processes during which the semiconductor film is not exposed to the atmosphere.

8. The thin film transistor according to claim 1, wherein at least a part of the oxide semiconductor film which includes a region in which the value of y is at least 90% of an absolute maximum value thereof over an entire thickness of the oxide semiconductor film is amorphous.

9. The thin film transistor according to claim 1, wherein the oxide semiconductor film comprises:
  a first region which includes the surface of the oxide semiconductor film at a side closer to the substrate and in which the value of y is from 0.8 to 1.2;
  a second region which includes the surface of the oxide semiconductor film at a side farther from the substrate and in which the value of y is from 0.8 to 1.2; and
  a third region which includes a region in which y takes an absolute maximum value over an entire thickness of the oxide semiconductor film and in which the value of y is 1.8 or more.

10. The thin film transistor according to claim 9, wherein at least one of a change in the value of y from the first region to the third region and a change in the value of y from the third region to the second region is continuous.

11. The thin film transistor according to claim 1, wherein the thin film transistor is a bottom-gate thin film transistor.

12. A method of producing the thin film transistor of claim 1, the method comprising:
  forming at least a part of the oxide semiconductor film which includes a region in which the value of y is at least 90% of an absolute maximum value thereof over an entire thickness of the oxide semiconductor film by a series of consecutive film-forming processes during which the oxide semiconductor film is not exposed to the atmosphere.

13. An electrooptic apparatus comprising the thin film transistor of claim 1.

14. A sensor comprising the thin film transistor of claim 1.

* * * * *